United States Patent [19]
Liang et al.

[11] Patent Number: 5,871,579
[45] Date of Patent: Feb. 16, 1999

[54] TWO-STEP DIPPING TECHNIQUE FOR THE PREPARATION OF ORGANIC-INORGANIC PEROVSKITE THIN FILMS

[75] Inventors: Kangning Liang, Mohegan Lake; David Brian Mitzi, Chappaqua; Michael T. Prikas, Valley Stream, all of N.Y.

[73] Assignee: International Business Machines Corporation, Armonk, N.Y.

[21] Appl. No.: 935,071

[22] Filed: Sep. 25, 1997

[51] Int. Cl.[6] ..................................................... C30B 7/14
[52] U.S. Cl. ................................ 117/68; 117/54; 117/64; 117/70; 117/925; 117/940
[58] Field of Search ................................ 117/54, 64, 68, 117/70, 925, 940

[56] References Cited

U.S. PATENT DOCUMENTS

| | | | |
|---|---|---|---|
| 3,719,611 | 3/1973 | Topol et al. | 252/519.3 |
| 3,719,746 | 3/1973 | Johnston | 423/463 |

OTHER PUBLICATIONS

Mitzi et al., "Conducting tin halides with a layered organic–based perovskite structure", Nature vol. 369, pp. 467–469, Jun. 9, 1994.

Mitzi et al., "Conducting Layered Organic–Inorganic Halides Containing (110)_Orineted Perovskite Sheets", Science vol. 267 pp. 1473–1476, Mar. 10, 1995.

Primary Examiner—Robert Kunemund
Attorney, Agent, or Firm—Stephen S. Strunck

[57] ABSTRACT

A convenient two-step dipping technique for preparing high-quality thin films of a variety of perovskites is provided by the invention. Thin films of $MI_2$ (M=Pb, Sn) were first prepared by vacuum-depositing $MI_2$ onto ash glass or quart substrates, which were subsequently dipped into a solution containing the desired organic ammonium cation for a short period of time. Using this technique, thin films of different layered organic-inorganic perovskites $(RNH_3)_2(CH_3NH_3)_{n-1}M_nI_{3n+1}$ (R=butyl, phenethyl; M=Pb, Sn; and n=1, 2) and three-dimensional perovskites $CH_3NH_3MI_3$ (M=Pb, Sn; i.e. n=$\infty$) were successfully prepared at room temperature. The lattice constants of these dip-processed perovskites are very similar to those of the corresponding compounds prepared by solution-growth or by solid state reactions. The layered perovskite thin films possess strong photoluminescence, distributed uniformly across the film areas. Similar results are achieved starting from spin-coated $MI_2$ films, which were dipped into appropriate solutions of the organic ammonium cations. The process of the invention can be used for a variety of organics and inorganics, even if they have incompatible solubility characteristics or even if the organic component is susceptible to thermal decomposition on heating. Thin perovskite films prepared by the method are attractive candidates for emitter materials in electroluminescent devices.

19 Claims, 10 Drawing Sheets

TWO-STEP DIPPING TECHNIQUE FOR THE PREPARATION OF ORGANIC-INORGANIC PEROVSKITE THIN FILMS

The invention herein was made with Government support under contract No. DAAL01-96-C-0095 awarded by ARPA. The Government has certain rights in this invention.

BACKGROUND OF THE INVENTION

Organic-inorganic perovskites have recently attracted much attention due to their unique electrical, magnetic, and optical properties, as well as their excellent film processability. Layered perovskites, $(RNH_3)_2(CH_3NH_3)_{n-1}M_nI_{3n+1}$ (M=group IVB metal), naturally form a quantum-well structure in which a two-dimensional semiconductor layer of corner-sharing $MI_6$ octahedra and an organic ammonium layer are alternately stacked. The excitons, resulting from the low-dimensionality of these semiconductor sheets, have a binding energy of several hundred milli-electron-volts, which enables strong emission even at room temperature. Their strong room temperature photoluminescence, along with significant photoluminescence wavelength tunability make the organic-inorganic perovskites attractive candidates for emitter materials in electroluminescent devices. Era et al., in Appl. Phys. Lett., V. 65, p. 676, have recently (1994) reported an electroluminescent device using the layered perovskite $(C_6H_5C_2H_4NH_3)_2PbI_4$ as an emitter material. At liquid nitrogen temperature, an electroluminescent intensity of 10,000 cd/m$^2$ was obtained at a current density of 2 A cm$^{-2}$, using an applied voltage of 24 V.

Proper processing is essential in order to generate the material quality and morphology required to observe strong luminescence or to build devices. Single crystals and deposited thin films are two of the most useful forms for studies of optical and electrical properties. In general, when high-quality single crystals are required, crystal growth from the melt phase is often used. However, as a result of the organic ammonium cations, which decompose at relatively low temperature (<250° C.), organic-inorganic perovskites are typically made using solution chemistry techniques. Crystals resulting from solution methods are often, however, too small or of insufficient quality to be useful in device applications.

For the preparation of thin films, the spin-coating technique is suitable for processing many organic-inorganic perovskites because they are often substantially soluble in conventional organic solvents. Spin-coating can be considered a special case of solution crystal growth. It allows the formation of perovskites on a substrate, while the solvent is evaporating off. Using this method, high-quality, highly oriented layered perovskite thin films can often be obtained. However, control of film thickness, uniformity, and surface morphology is difficult using spin-coating. In addition, while simple organic ammonium salts are soluble in a range of organic solvents, including those which can dissolve the inorganic $MI_2$ salt, for more complex organic cations, the choice of solvent becomes more limited. Furthermore, solvent techniques are not always compatible with the $MI_2$ salt, due to problems with solubility, strong solvent coordination or the stability of the metal valence state.

Vacuum evaporation techniques have also recently been employed to grow oriented thin films of layered perovskites through a dual-source vapor deposition process. The benefits of this technique are that it is possible to precisely control the thickness and smoothness of the thin film surfaces. However, the preparation of various perovskites using different organic components is limited because each organic component easily contaminates the inside of the evaporation equipment. In addition, in some cases, the organic salt might not be thermally stable up to the temperatures required for evaporation, making this approach impractical for these systems. Even when it is possible to evaporate the organic salt, it is often difficult to balance the organic and inorganic rates, an important criterion for achieving the correct compositions of the resulting perovskite films. It is even more problematic that for each new organic-inorganic system, a re-establishment of the rates has to be carried out empirically.

SUMMARY OF THE INVENTION

A convenient two-step dipping technique for preparing high-quality thin films of a variety of perovskites is provided by the invention. Thin films of $MI_2$ (M=Pb, Sn) were first prepared by vacuum-depositing $MI_2$ onto ash glass or quartz substrates, which were subsequently dipped into a solution containing the desired organic ammonium cation for a short period of time. Using this technique, thin films of different layered organic-inorganic perovskites $(RNH_3)_2(CH_3NH_3)_{n-1}$ (R=butyl, phenethyl; M=Pb, Sn; and n=1, 2) and three-dimensional perovskites $CH_3NH_3MI_3$ (M=Pb, Sn; i.e. n=∞) were successfully prepared at room temperature. The lattice constants of these dip-processed perovskites are very similar to those of the corresponding compounds prepared by solution-growth or by solid state reactions. The layered perovskite thin films possess strong photoluminescence, distributed uniformly across the film areas. Similar results are achieved starting from spin-coated $MI_2$ films, which were dipped into appropriate solutions of the organic ammonium cations. The process of the invention can be used for a variety of organics and inorganics, even if they have incompatible solubility characteristics or even if the organic component is susceptible to thermal decomposition on heating. Thin perovskite films prepared by the new method are attractive candidates for emitter materials in electroluminescent devices.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which.

DETAILED DESCRIPTION OF THE INVENTION

Vacuum evaporation of the $MI_2$ films (M=Pb, Sn) was performed using an evaporation chamber. The $MI_2$ powder ($PbI_2$, Alfa Aesar, 99.999%; $SnI_2$, APL Engineered Materials, 99.999%) was loaded into a quartz crucible, placed into the chamber, and the system was pumped down to a base pressure of about $4 \times 10^{-7}$ Torr before beginning the evaporation. The metal iodide was evaporated and deposited onto ash glass or quartz substrates, which were maintained at room temperature, achieving a pressure of approximately $1 \times 10^{-6}$ Torr during the deposition. During the deposition, the deposition rate and film thickness were monitored using a quartz crystal balance, with the deposition rates typically kept in the range of 60 to 70Å/min. The $MI_2$ films were immediately transferred into a nitrogen-filled drybox after deposition.

The resultant films were transparent, with the $PbI_2$ film having a light yellow color and $SnI_2$ a greenish-yellow color. The thin films were uniform and smooth, as indicated by the profiles measured on an Alpha-Step 200 and an AFM, and the final film thicknesses were in the range of 2000 to 3000Å. X-ray diffraction indicated that they consisted of grains which were primarily c-axis oriented with respect to the substrate.

In addition to the evaporated metal(II) iodide films, spin-coated films were also used as a starting point for the dipping process. Spin-coating was performed in a nitrogen-filled drybox and the spin rate was electronically controlled to be approximately 1600 rpm. Saturated methanol solutions of metal(II) iodides were employed for the spin-coating. As was the case for the evaporated films, the spin-coated $MI_2$ films were primarily c-axis oriented.

Preparation of the organic salt solutions was performed as follows. The solutions of organic ammonium iodides were prepared by dissolving 107 mg of butylammonium iodide ($C_4H_9NH_2 \cdot HI$) or 268 mg of phenethylammonium iodide ($C_6H_5C_2H_4NH_2 \cdot HI$) in 1 ml of 2-propanol (Aldrich, anhydrous). The 2-propanol ($C_3H_8O$) solution was then diluted with 6 ml of toluene (Aldrich, anhydrous). The molar concentrations for the butylammonium iodide and the phenethylammonium iodide solutions were 38 mM (millimolar) and 77 mM, respectively. Due to the limited solubility in the above mixed solvent, 7 ml of pure 2-propanol was used to dissolve 140 mg of methylammonium iodide ($CH_3NH_2 \cdot HI$) to prepare a 127 mM solution of this organic salt. A solution containing 2 equivalents of butylammonium iodide, and 1 equivalent of methylammonium iodide was prepared by completely dissolving 80 mg of butylammonium iodide, or 0.40 millimole (mmol), and 32 mg of methylammonium iodide (0.20 mmol) in 5 ml of 2-propanol, and then diluting this solution with 25 ml of toluene ($C_7H_8$). All of the solutions were kept in a nitrogen-filled drybox.

The butylammonium iodide used in the above solutions was prepared by bubbling hydrogen iodide (Matheson Gas Products) into a butylamine (Aldrich) chloroform solution. Phenethylammonium iodide and methylammonium iodide were previously prepared in this laboratory by mixing aqueous solutions of the organic amine and hydriodic acid and drying the product under vacuum.

To prepare the films by dipping, each $MI_2$ thin film was immersed into a solution (in a nitrogen-filled drybox) containing the desired organic ammonium iodide for a selected period of time. After the film was taken out from the dipping solution, it was immediately immersed in a rinse solution, which had the same composition as the dipping solution solvent (without the dissolved organic ammonium salt), for 5–10 seconds, to remove any excess organic ammonium salt. Before the thin film was transferred out of the drybox for measurements, it was pumped in the drybox loading lock for 10 minutes to ensure that any remaining solvent was removed. The specific films were prepared as follows:

$(C_4H_9H_3)_2PbI_4$. Upon immersing an evaporated $PbI_2$ thin film into the 38 mM butylammonium iodide solution, it immediately turned an opaque yellow. Although there were no significant changes in appearances for the thin films prepared with different dipping duration, ranging from 5 seconds to 10 minutes, X-ray diffraction showed that it took about 1 to 3 minutes to complete the reaction of converting all the $PbI_2$ into the perovskite compounds. In terms of photoluminescence, it was of little benefit to extend the dipping duration beyond 2 minutes. In fact, it sometimes caused the formed perovskite films to partially come off the substrate if the immersion period was longer than 30 minutes, resulting in films with rough surfaces.

Spin-coated films of $PbI_2$ also formed $(C_4H_9N_3)_2PbI_4$ when they were dipped into a butylammonium iodide solution. Typically, a period longer than 1 minute was used for dipping the spin-coated films in the solution of butylammonium iodide. The films showed yellowish color after the dipping process and they were still transparent (in contrast to the films prepared from evaporated $PbI_2$). The absorption spectrum showed that a dipped spin-coated film of $PbI_2$ had an strong absorption peak at 524 nm, in accordance with the absorption peak associated with free excitons in single crystals of $(C_4H_9NH_3)_2PbI_4$.[10]

$(C_6H_5C_2H_4NH_3)PbI_4$: The procedure of dipping $PbI_2$ films into phenethylammonium iodide solution was similar to the butylammonium iodide analog. The resultant films of $(C_6H_5C_2H_4NH_3)_2PbI_4$ were yellow and not transparent. In the dipping process, a 1 to 3 minute period was generally required to complete the reaction between the $PbI_2$ films and phenethylammonium iodide in the solution. Longer than 20 minutes of dipping duration usually led to rough films.

$CH_3NH_3PbI_3$: The three-dimensional perovskites were also formed when methylammonium iodide was used in the dipping solution. As soon as a $PbI_2$ film was introduced into a methylammonium iodide 2-propanol solution the film turned black, indicating the formation of a surface layer of $CH_3NH_3PbI_3$. To complete the transformation of the film into the three-dimensional perovskite required a period of 1 to 3 hours, much longer than for the synthesis of the layered perovskite films. The resulting $CH_3NH_3PbI_3$ perovskite films were black and uniform.

$(C_4H_9NH_3)_2(CH_3NH_3)Pb_2I_7$. The preparation of thin films of the bilayer (i.e. n=2) perovskite, $(C_4H_9NH_3)_2(CH_3NH_3)Pb_2I_7$, was carried out stepwise. First, a $PbI_2$ film was dipped into the 38 mM butylammonium iodide solution for 10 seconds, resulting in a film of $(C_4H_9NH_3)_2PbI_4$. It was then dipped for 3 minutes into the mixed solution containing 2 equivalents of butylammonium iodide and 1 equivalent of methylammonium iodide. The resulting film appeared bright red and was not transparent. Using these dipping parameters, No evidence for lower order (i.e., n=1) or higher order (n>2) members of the perovskite family could be detected using X-ray diffraction. The $(C_4H_9NH_3)_2(CH_3NH_3)Pb_2I_7$ film changed little for samples with dipping periods up to 3 hours. However, a 12 hour dipping duration eventually led to a dark gray film, which was identified by X-ray diffraction as primarily $CH_3NH_3PbI_3$.

The order of the procedure is vital for the preparation of the n =2 compound. If a $PbI_2$ thin film was directly immersed into a $C_4H_9NH_2 \cdot HI$—$CH_3NH_2 \cdot HI$ (2:1, molar ratio) solution, the reaction did not lead to the formation of $(C_4H_9NH_3)_2(CH_3NH_3)Pb_2I_7$. Instead, $CH_3NH_3PbI_3$ was formed, as shown by the X-ray diffraction pattern. When a $PbI_2$ thin film was first immersed into a methylammonium iodide solution, the resulting $CH_3NH_3PbI_3$ material did not convert into $(C_4H_9NH_3)_2(CH_3NH_3)Pb_2I_7$ dipping it into either the $C_4H_9NH_2 \cdot HI$—$CH_3NH_2 \cdot HI$ or the $C_4H_9NH_2 \cdot HI$ 2-propanol solution, even for periods of up to 12 hours.

$(C_4H_9NH_3)_2SnI_4$: The dipping process for $(C_4H_9NH_3)_2SnI_4$ films was similar to that of the lead(II) analog, although the reactions were found to proceed at a faster rate. A $SnI_2$ film was first immersed into a 70 mM butylammonium iodide 1:16 volume ratio solution of 2-propanol/toluene (1:16, v/v) for 2 seconds and then rinsed with toluene, yielding an opaque red-brown film. It emitted a nominally orange light under excitation from a 366 nm hand-held light.

$(CH_6C_2H_4NH_3)SnI_4$: The film of $(C_6H_5C_2H_4NH_3)_2SnI_4$ was prepared by first dipping a $SnI_2$ film into a saturated phenethylammonium iodide 2-propanol/toluene (1/16, v/v) solution for 3 seconds and then taking it out of the solution to dry in a nitrogen atmosphere. This procedure was repeated twice, and the resulting film was rinsed with the same mixed solvent in the absence of phenethylammonium iodide. The resulting film was red-brown and not transparent. An orange emission was seen when it was exposed to 366 nm light.

$CH_3NH_3SnI_3$: The films of $CH_3NH_3SnI_3$ were also black, similar to those of $CH_3NH_3PbI_3$. They were prepared by dipping the $SnI_2$ films into an 88 mM methylammonium iodide 2-propanol solution for 30 seconds. The resulting films were rinsed with 2-propanol. While the reaction between the $SnI_2$ films and methyl ammonium iodide was slower than for the corresponding two-dimensional butylammonium or phenethylammonium compounds, it was much faster than for the formation of the Pb analog.

Room temperature X-ray diffraction patterns were collected over the range of $2° \leq 2\theta \leq 60°$ for each $MI_2$ thin film and each perovskite thin film, using a Siemens D5000 diffractometer (Cu $K\alpha$ radiation). All the samples were measured directly under ambient conditions, except the $CH_3NH_3SnI_3$ films, which were cut into 1×2 cm stripes and contained in an air-tight cell filled with nitrogen from the drybox. The indexing of the diffraction peaks was performed for the perovskite films based on a comparison with the patterns from the corresponding materials prepared using a solution chemistry method or solid state reactions. The lattice constants were refined using the Siemens WIN-METRIC program after removing the background and the $K\alpha2$ component from the diffraction pattern.

Absorption spectra were recorded on a Hewlett Packard UV-Vis 8543 spectrophotometer. Excitation and emission spectra were taken on a Spex Fluorolog-2 spectrophotometer using a front-face geometry. The incident light was from a xenon arc lamp which was passed through a SPEX 1680 0.22 m double spectrometer. The emission was detected using a SPEX 1911F detector after it was passed through a similar double spectrometer.

The emission spectra of each sample were collected with three different excitation wavelengths (350 nm, 385 nm, and 480 nm, for example, for the $(C_4H_9NH_3)_2PbI_4$ films) to ensure that the emission spectra were independent of excitation wavelength.

The room temperature AFM images of the various thin films were recorded on a Nanoscope III (DFM-5000) (Digital Instruments, Calif.). The scan area was typically $10 \times 10$ $\mu$m for preliminary scans and $3 \times 3$ $\mu$m for more detailed scans.

The selection of the solvents for dissolving the organic ammonium iodides was found to be critical for obtaining high-quality thin films of the perovskites using the new dipping technique. The criteria for choosing the solvents are that they must be good solvents for the organic ammonium iodides, but poor solvents for the metal(II) iodides and the resulting perovskite compounds. While both hexane and toluene do not dissolve metal(II) iodides and the corresponding perovskites, they are not appropriate solvents because the organic ammonium salts that were used are only slightly soluble in them. For example, $PbI_2$ thin films only minimally reacted after being immersed in a saturated butylammonium iodide/toluene solution for 12 hours. In contrast, 2-propanol is a good solvent for organic ammonium salts as well as for the layered perovskites. When a $PbI_2$ thin film was dipped into a butylammonium iodide/2-propanol solution, it dissolved into the solution in a few seconds. In order to balance these two extremes, a mixed solvent was chosen, with a composition of 1 portion of 2-propanol to 6 portions of toluene by volume for $A_2PbI_4$, and 1 portion of 2-propanol to 16 portions of toluene for $A_2SnI_4$ ($A=C_4H_{9NH3}$ and $C_6H_5C_2H_4NH_3$). The smaller ratio of 2-propanol in the case of $A_2SnI_4$ helped to obtain better films because of higher solubility for the tin(II) compounds compared to the corresponding lead(II) materials. In the case where methylammonium iodide was used to yield the three-dimensional perovskites, pure 2-propanol was used, as methylammonium iodide was only slightly soluble in the above mixed-solvent system. More importantly, the resulting $CH_3NH_3MI_3$ perovskite films did not degrade during the synthetic process (a period of time up to 3 hours), enabling the complete reaction of the $MI_2$ thin films.

The reaction between the organic ammonium iodides and the $MI_2$ films was very fast, especially for the layered perovskites. The formation of the perovskites was seen as soon as the $MI_2$ thin films were immersed into the organic ammonium solutions. In fact, a $PbI_2$ thin film, dipped in a butylammonium iodide solution for shorter than 5 seconds, had comparable photoluminescence intensity with the one which was dipped in the same solution for 5 minutes or longer. As X-ray diffraction patterns demonstrated, $PbI_2$ was sometimes detected in the perovskite films which were made using a dipping duration of less than 1 minute. A 1 to 3 minute period appeared to be necessary for all the lead(II) iodide in the films to be completely converted into perovskite. Tin(II) iodide thin films were found to react at a faster rate than the corresponding lead iodide films, with the reactions often being completed within a few seconds.

Surprisingly, the reactions of the invention are completed very quickly, even for relatively thick films. The reactions, therefore, are believed to occur through the organic ammonium iodides diffusing to the perovskite/metal(II) iodide interface, and subsequently reacting with the metal(II) iodides to form more of the perovskite. Layered perovskites consist of alternate inorganic layers and organic bilayers. This presumably allows organic ammonium iodide molecules to more easily diffuse into the structure along the van der Waals gap formed between organic layers of the structure.

Compared to the layered perovskites, $A_2MI_4$, a much longer time is required to complete the reaction between metal(II) iodides and methylammonium iodide, which results in the formation of the three-dimensional perovskites, $CH_3NH_3MI_3$. In a methylammonium iodide solution, $MI_2$ rapidly reacts and forms a thin layer of the perovskite at the solution-film interface, as indicated by a color change for the film. In contrast to the layered perovskites, however, this surface layer does not aid in the diffusion of methylammonium iodide from the solution into the interior of the film, since the three-dimensional structure lacks a van der Waals gap.

The importance of thermodynamics for the reactions between organic ammonium salts and $PbI_2$ was revealed by the formation process for the $(C_4H_9NH_3)_2(CH_3NH_3)Pb_2I_7$ films. $CH_3NH_3PbI_3$ is found to be thermodynamically more stable relative to the other members of the layered perovskite family. This accounts for the fact that dipping a lead(II) iodide-based film into a $C_4H_9NH_2 \cdot HI$—$CH_3NH_2HI$ (2:1, molar ratio) solution eventually gave rise to $CH_3NH_3PbI_3$, regardless of the starting film. $(C_4NH_3)_2(CH_3NH_3)Pb_2I_7$ is apparently just an intermediate for the conversion of $(C_4H_9NH_3)_2PbI_4$ into $CH_3NH_3PbI_3$ in the presence of methylammonium iodide. Fortunately, the kinetics are slow enough to enable the n=2 material to form as a metastable intermediate.

Figure 1:
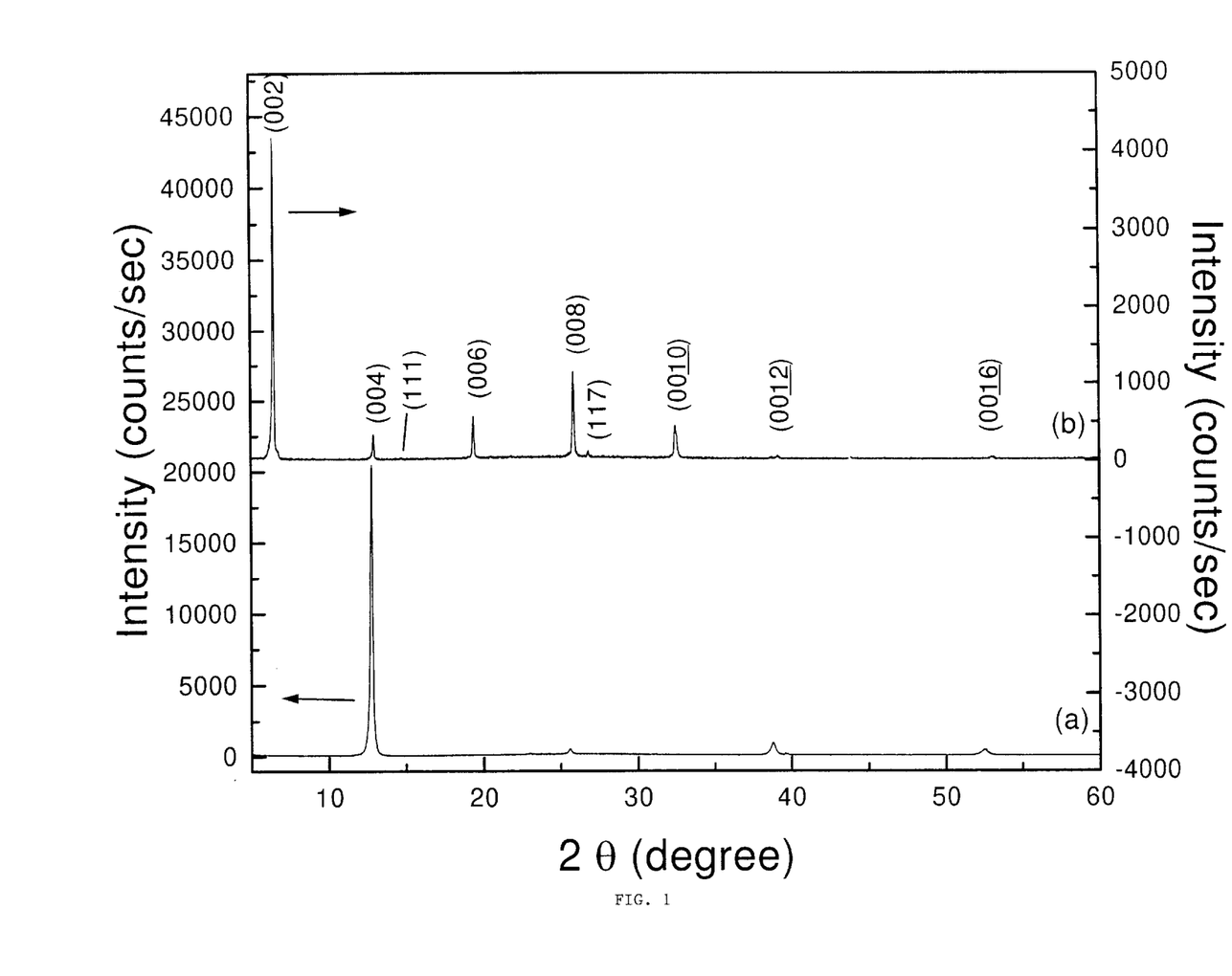
FIG. 1 shows room temperature X-ray diffraction patterns for (A) a vacuum deposited $PbI_2$ thin film, and (B) a $(C_4H_9NH_3)_2PbI_4$ thin film prepared by dipping the $PbI_2$ thin film into a 38 mM butylammonium iodide 2-propanol/toluene solution for 1 minute.

The vacuum-deposited $PbI_2$ thin films were mainly c-axis oriented, as indicated, for example, by the X-ray diffraction pattern shown in FIG. 1(A). Higher order [001] diffraction peaks were detected, suggesting that these $PbI_2$ films were reasonably well-ordered. Upon dipping into the butylammonium iodide solution, the c-axis oriented $PbI_2$ films resulted in predominantly c-axis oriented thin films of the layered perovskite, $(C_4H_9NH_3)_2PbI_4$, as shown in FIG. 1(B). It can be seen that the c-axis diffraction peaks overwhelmingly dominate the diffraction pattern, with 7 observed [001] peaks. The presence of higher order peaks indicates that the formed perovskite film is well-crystallized. Although they are also c-axis oriented, the thin films of the layered perovskite $(C_6H_5C_2H_4NH_3)_2PbI_4$, prepared using dual source vapor deposition, appeared to be less organized, as indicated by the absence of higher order diffraction peaks.

While the strongest reflections from the thin films were [001] peaks, several off-axis reflections (which tended to be weak, but varied in intensity depending on preparation conditions) could also be detected for some of the films, enabling the determination of the lattice constants for the perovskite films. All of the 13 diffraction peaks for the $(C_4H_9NH_3)_2PbI_4$ film were successfully indexed (all of them were singly indexed) and the refined orthorhombic lattice parameters were, a=8.882(2)Å, b=8.696(3)Å, c=27.631(5) Å. This is in good agreement with the parameters, a =8.886 (2)Å, b=8.698(2)Å, c=27.637(5)Å for samples prepared by a solid state reaction at 160° C., and a =8.863(2)Å, b=8.682 (1) A, c =27.570(2) A for single crystals prepared by a solution crystal growth technique.

Figure 2:
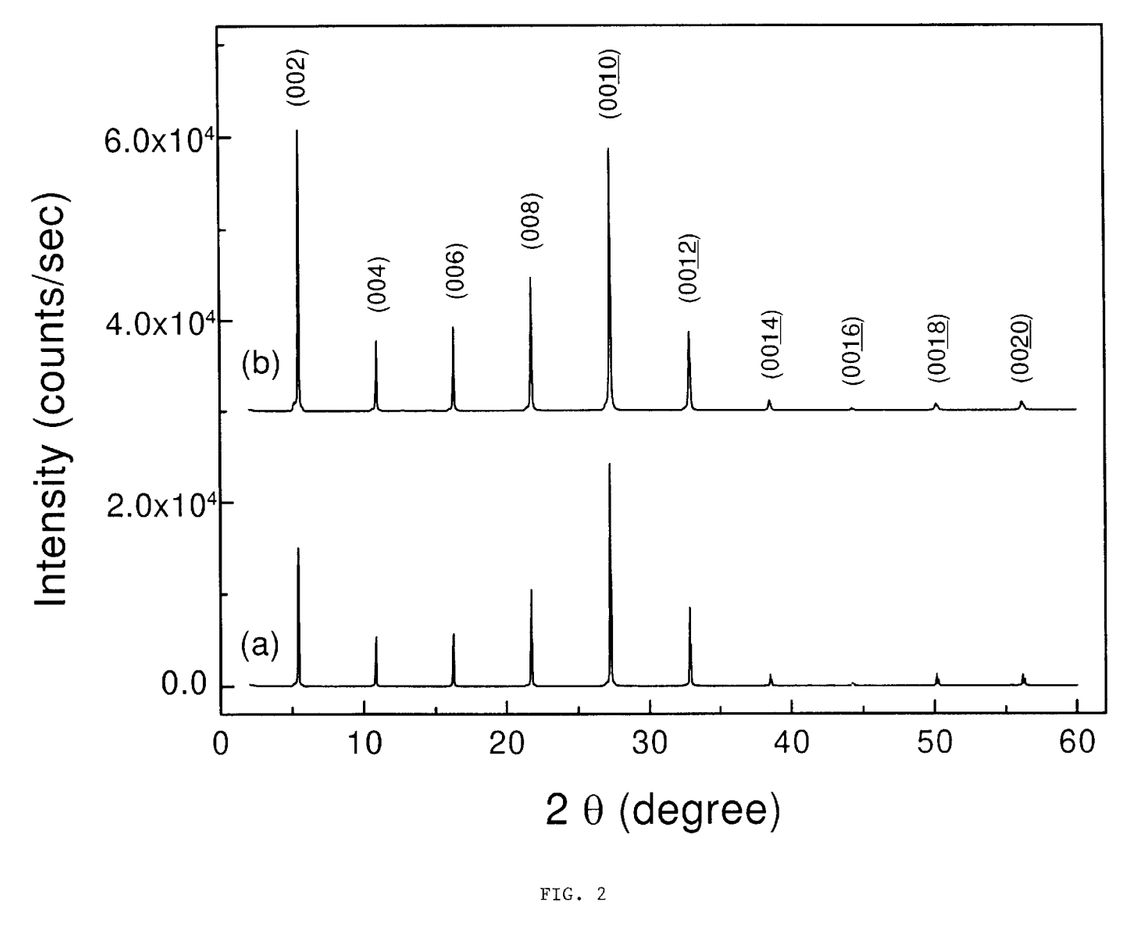
FIG. 2 shows room temperature X-ray diffraction patterns for (a) slightly ground $(C_6H_5C_2H_4NH_3)_2PbI_4$ crystals prepared using a solution chemistry technique, (B) a $(C_6H_5C_2H_4NH_3)_2PbI_4$ thin film prepared by dipping a $PbI_2$ thin film into a 77 mM phenethylammonium iodide 2-propanol/toluene solution for 10 minutes.

The diffraction patterns of $(C_6H_5C_2H_4NH_3)_2PbI_4$ thin films showed that they were typically c-axis oriented, as for $(C_4H_9NH_3)_2PbI_4$. FIG. 2 demonstrates a good agreement between the diffraction pattern of a $(C_6H_5C_2H_4NH_3)_2PbI_4$ film made using the dipping method, FIG. 2A, and that of ground crystals prepared by diffusing a methanol solution of $C_6H_5CH_4NH_2 \cdot HI$ into an aqueous HI solution of $PbI_2$, FIG. 2B.

Figure 3:
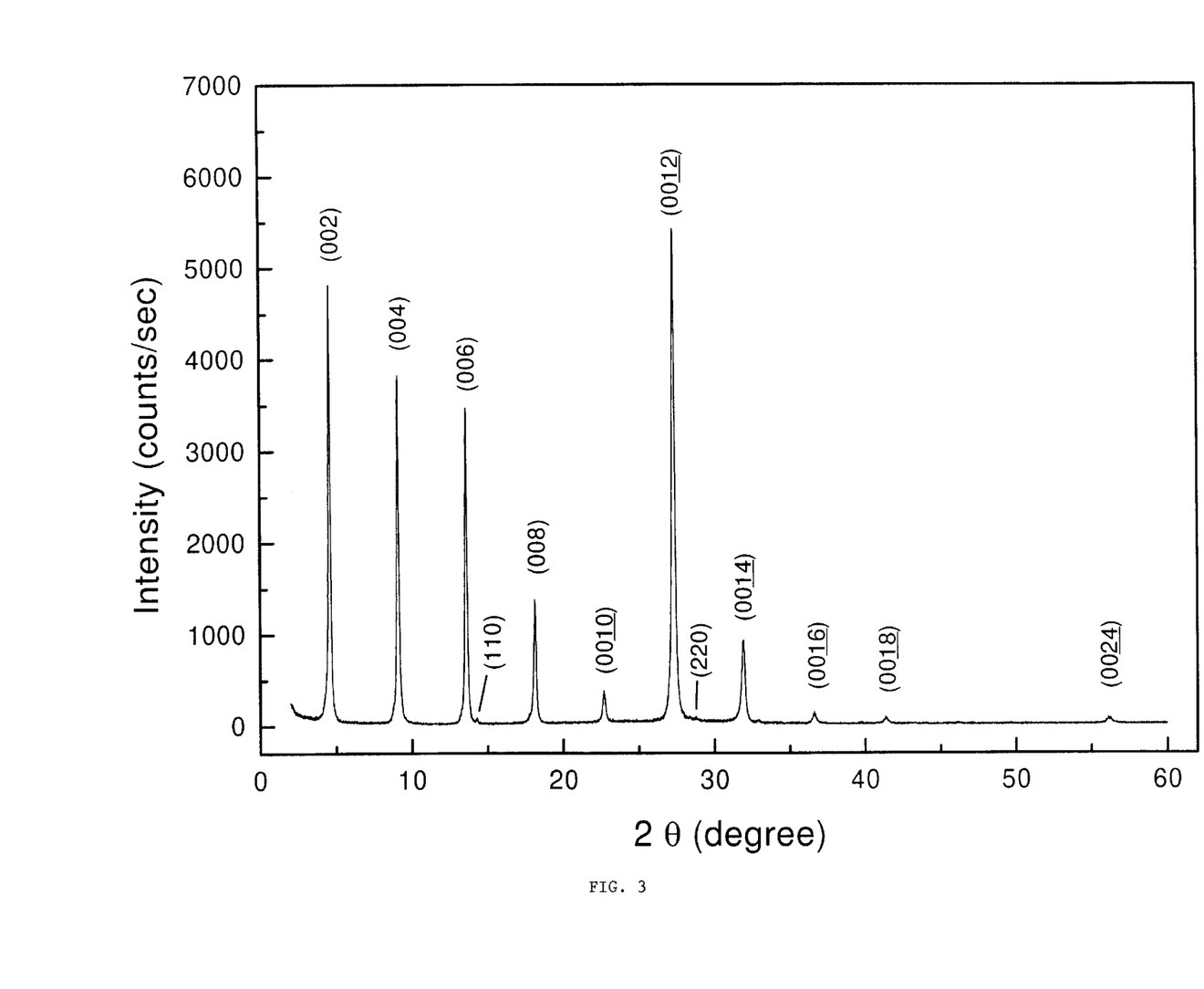
FIG. 3 shows the room temperature X-ray diffraction pattern for a $(C_4H_9NH_3)_2(CH_3NH_3)Pb_2I_7$ thin film synthesized by first dipping a $PbI_2$ thin film 38 mM butylammonium iodide 2-propanol/toluene solution for 10 seconds, and then into an 2-propanol solution, containing 2 equivalents of butylammonium iodide and 1 equivalent of methylammonium iodide, for 3 minutes.

The $(C_4H_9NH_3)_2(CH_3NH_3)Pb_2I_7$ (n=2) films also exhibited an X-ray diffraction pattern suggesting primarily c-axis orientation, as seen in FIG. 3. The long cell dimension along c-axis was 39.37Å, an increase of 11.78Å from the n=1 structure, $(C_4H_9NH_3)_2PbI_4$. For the tin(II) counterpart, the long unit-cell dimension perpendicular to the perovskite sheets increased from 27.576(2)Å for $(C_4H_9NH_3)_2SnI_4$ (n=1) to 39.395(5)Å for $(C_4H_9NH_3)_2(CH_3NH_3)Sn_2I_7$ (n=2), an increase of 11.819Å. The increase observed in both of these systems is the result of inserting two more $CH_3NH_3MI_3$ perovskite layers per unit cell.

Figure 4:
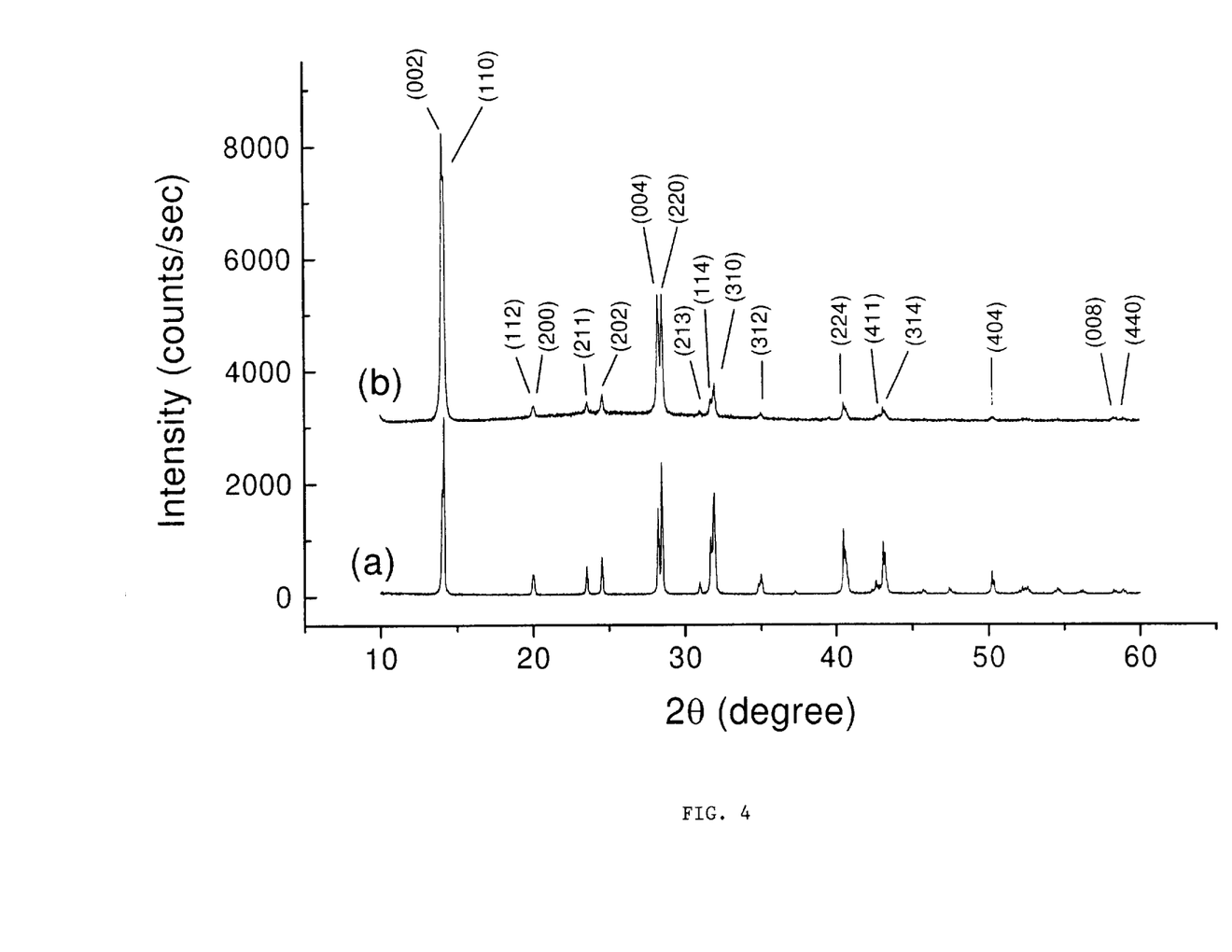
FIG. 4 shows room temperature X-ray diffraction patterns for (A) a powder sample of $CH_3NH_3PbI_3$ prepared using a solid state reaction, and (B) a thin film of $CH_3NH_3PbI_3$, prepared by dipping a $PbI_2$ thin film into a 127 mM methylammonium iodide 2-propanol solution for 3 hours.
Figure 5A:
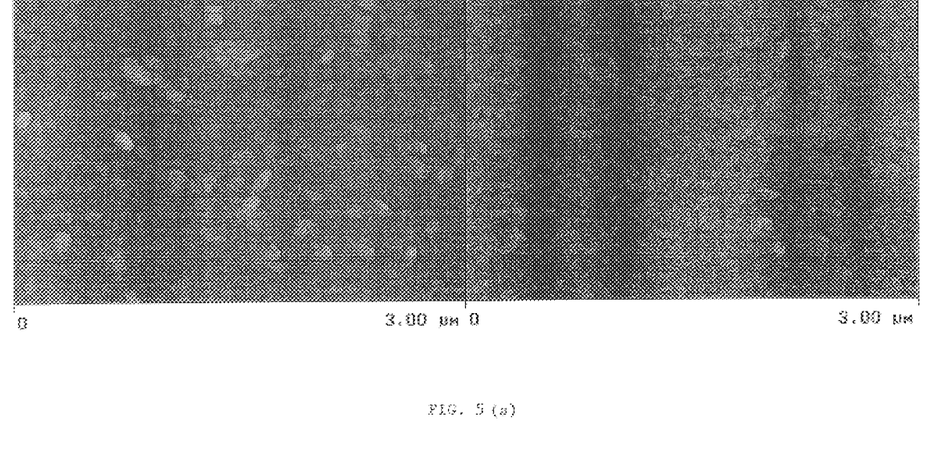
FIG. 5 are micrographs wherein the left frames are AFM topology images and the right frames are phase images for (A) a film of vacuum evaporated $PbI_2$; (B3), (C), and (D) films of $(C_4H_9NH_3)_2PbI_4$ prepared by dipping the evaporated $PbI_2$ films into the butylammonium iodide solution for 10, 60, and 180 seconds, respectively.
Figure 5B:
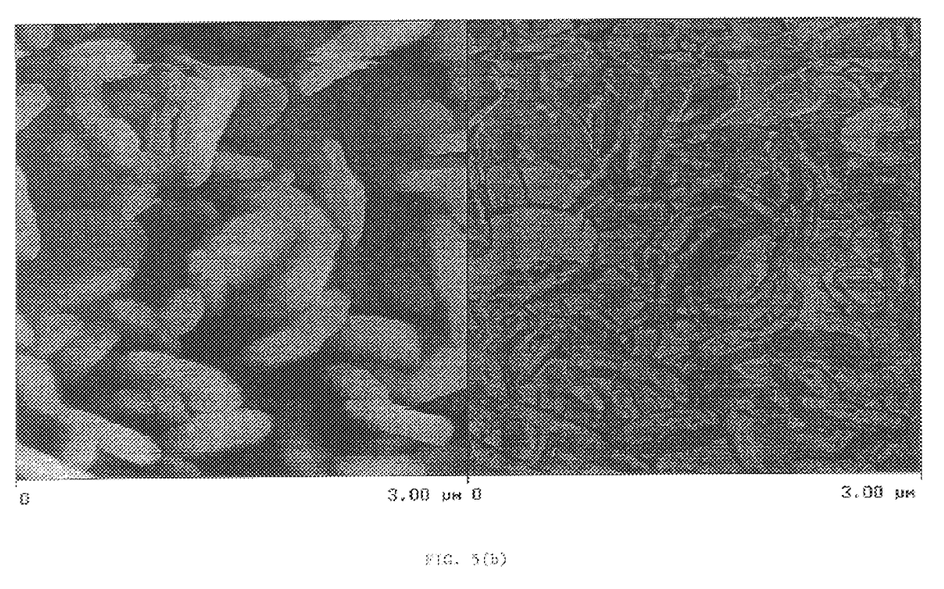
Figure 5C:
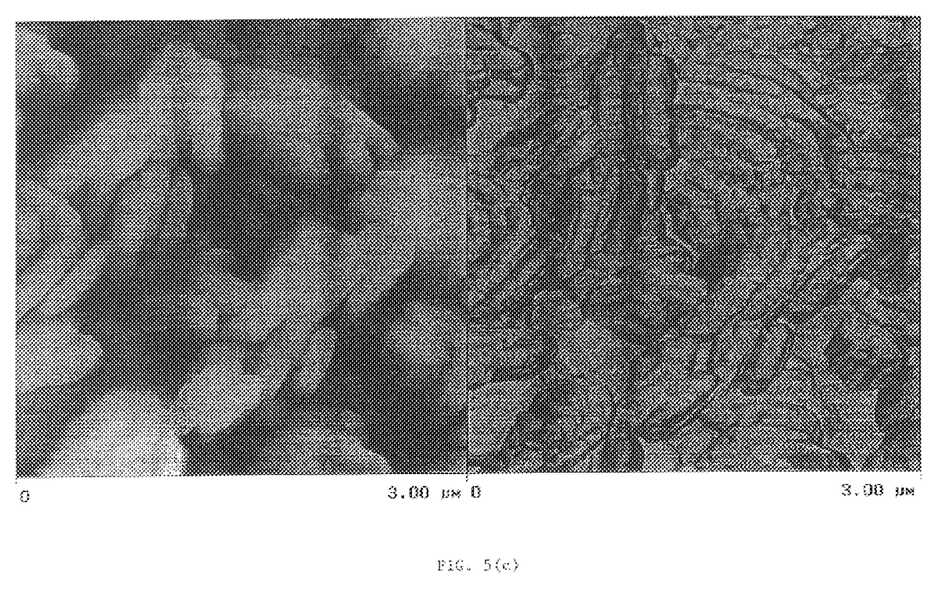
Figure 5D:
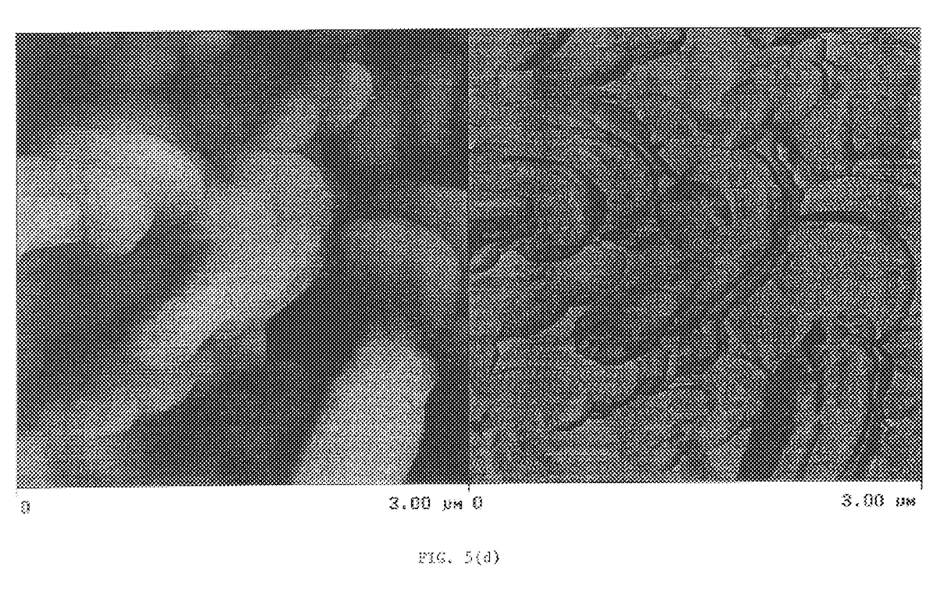

Dip-processed $CH_3NH_3PbI_3$ thin films exhibited very similar diffraction patterns to those of $CH_3NH_3PbI_3$ prepared by a solid state reaction, as shown in FIG. 4. The refined tetragonal lattice parameters, a=8.874(1)Å and c=12.670(3)Å, are virtually identical to the values, a=8.874Å and c=12.669Å, for a sample prepared by solid state synthesis.

For the dip-processed tin(II) systems, the X-ray diffraction patterns of $(C_4H_9NH_3)_2SnI_4$ and $(C_6H_5C_2H_4NH_3)_2SnI_4$ films were similar to those of corresponding crystals obtained by solution chemistry. Higher order [001] peaks were observed, indicating c-axis orientations of the films and reasonable crystalline order. The diffraction peaks for the $CH_3NH_3SnI_3$ film reflected a cubic unit cell, with the refined lattice parameter a=6.239(1)Å (compared to a=6.2397(5)Å for samples prepared by precipitation from an aqueous hydriodic acid solution).

Two-dimensional AFM topology and phase images, from the surfaces of a thermally deposited $PbI_2$ film and several $(C_4NH_3)_2PbI_4$ films, prepared using dipping times varying from 10–180 sec, are shown in FIG. 5. The surface of the evaporated $PbI_2$ film, FIG. 5A, had small grains evenly distributed over the film area and had a mean roughness of 9 nm. After this film had been dipped in a butylammonium iodide solution, the surface morphology dramatically changed. As shown in FIG. 5(B), small, well-defined, randomly distributed grains were observed for a film prepared by dipping for 10 seconds. The grains appeared to be plate-like, and the mean roughness of the film was about 97 nm. Compared to the undipped lead iodide film, the grains appeared to be substantially larger, with typical in-plane dimensions on the order of 0.6(2) µm and an average thickness of around 0.2(1) µm. X-ray diffraction indicates that a substantial fraction of the $PbI_2$ remained unreacted in this sample. For a film with a dipping duration of 60 seconds, in which most of the $PbI_2$ had reacted to form the corresponding perovskite, the grain size appeared larger and the mean roughness of the film increased to 121 nm. Although macroscopically the clusters were still randomly distributed, they were now often composed of two or three plate-like grains which were packed together in parallel, as shown in both the topology and phase images (FIG. 5(C)). FIG. 5(D) shows the images of a film dipped for 180 seconds in a butylammonium iodide solution. In this case the $PbI_2$ had completely reacted, as indicated by its X-ray diffraction pattern. The mean roughness of this film (113 nm) changed little relative to that for the 60 second dipping duration. However, the plate-like grains appeared to have grown ether relative to the shorter dipping duration samples, with many grains having in-plane dimensions larger than 1 $\mu$m. These results indicate that the arrangement and size of the perovskite grains strongly depend upon the dipping duration.

Figure 6:
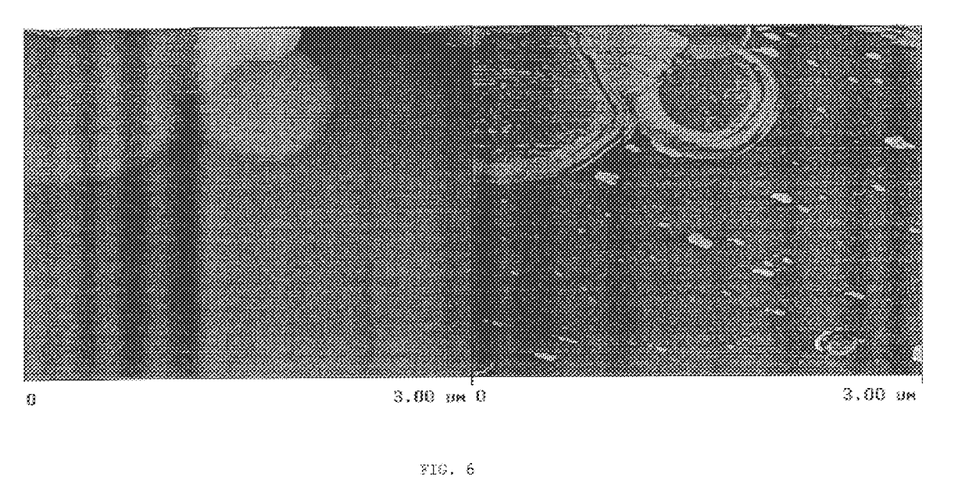
FIG. 6 shows AFM topology (left) and phase (right) images of a film of $(C_4H_9NH_3)_2PbI_4$ prepared by dipping a spin-coated $PbI_2$ film into the butylammonium iodide solution for 1 minute.

The structure of the layered perovskites is highly anisotropic and crystal growth tends to occur most easily along the plane of the perovskite sheets and more slowly along the perpendicular direction to the sheets. Consequently, crystals of these materials tend to grow as plate-like crystals, with the in-plane dimension corresponding to the plane of the perovskite sheets. In examining FIG. 5, the plate-like crystals appear to be approximately randomly oriented with respect to the substrate. This would suggest some a-b orientation to the films, rather than pure c-axis orientation. However, while there were typically off-axis reflections observed in the X-ray diffraction patterns for these films, the c-axis pattern The images of spin-coated $PbI_2$ films from a methanol solution show that they are smooth and homogeneous, with a mean roughness of 1.7 nm. After it had been dipped in a butylammonium iodide solution for 1 minute, the X-ray diffraction pattern showed that all the $PbI_2$ had reacted, and the surface roughness increased, with plate-like domains forming on the surface (FIG. 6). While the surface of the dip-processed sample from the evaporated $PbI_2$ film was uniformly rough, with crystallites sticking out of the surface over the entire area of the film, the film resulting from the spin-coated $PbI_2$ had a substantial amount of smooth area, with however sizable crystals growing out of the surface over some interval. This difference in surface morphology presumably at least partially accounts for the difference in optical transparency between the organic-inorganic films prepared from spin-coated $PbI_2$ as opposed to those prepared from evaporated $PbI_2$.

In contrast to the films prepared from the two-step dipping process, the thin films prepared by spin-coating from an acetonitrile solution of $(C_4H_9NH_3)_2PbI_4$ yielded a much smoother film, with mean roughness of only 1.1 nm. There were small dark spots homogeneously distributed over the film surface. Presumably these are tiny crystals of $(C_4H_9NH_3)_2PbI_4$ formed in the course of spin-coating. While the dip-coated films appear substantially rougher, the surface morphology is expected to depend on the choice of the solvent system used during the dipping process. The fall range of potential solvents has only begun to be explored. Furthermore, it may be possible to control the orientation of the perovskite films using the dipping process. Finally, it should be easier to control thickness uniformity over larger areas using dip-processing.

Single crystals of organic-inorganic layered perovskites, $(RNH_2)_2MI_4$ (M=Pb, Sn) exhibit strong exciton absorption and sharp exciton emission in the visible range at room temperature. The luminescence originates from electronic transitions within the inorganic perovskite layer. Due to their natural quantum-well structure, it is possible to tailor optical properties by varying either the organic or the inorganic components of the structure.

Figure 7:
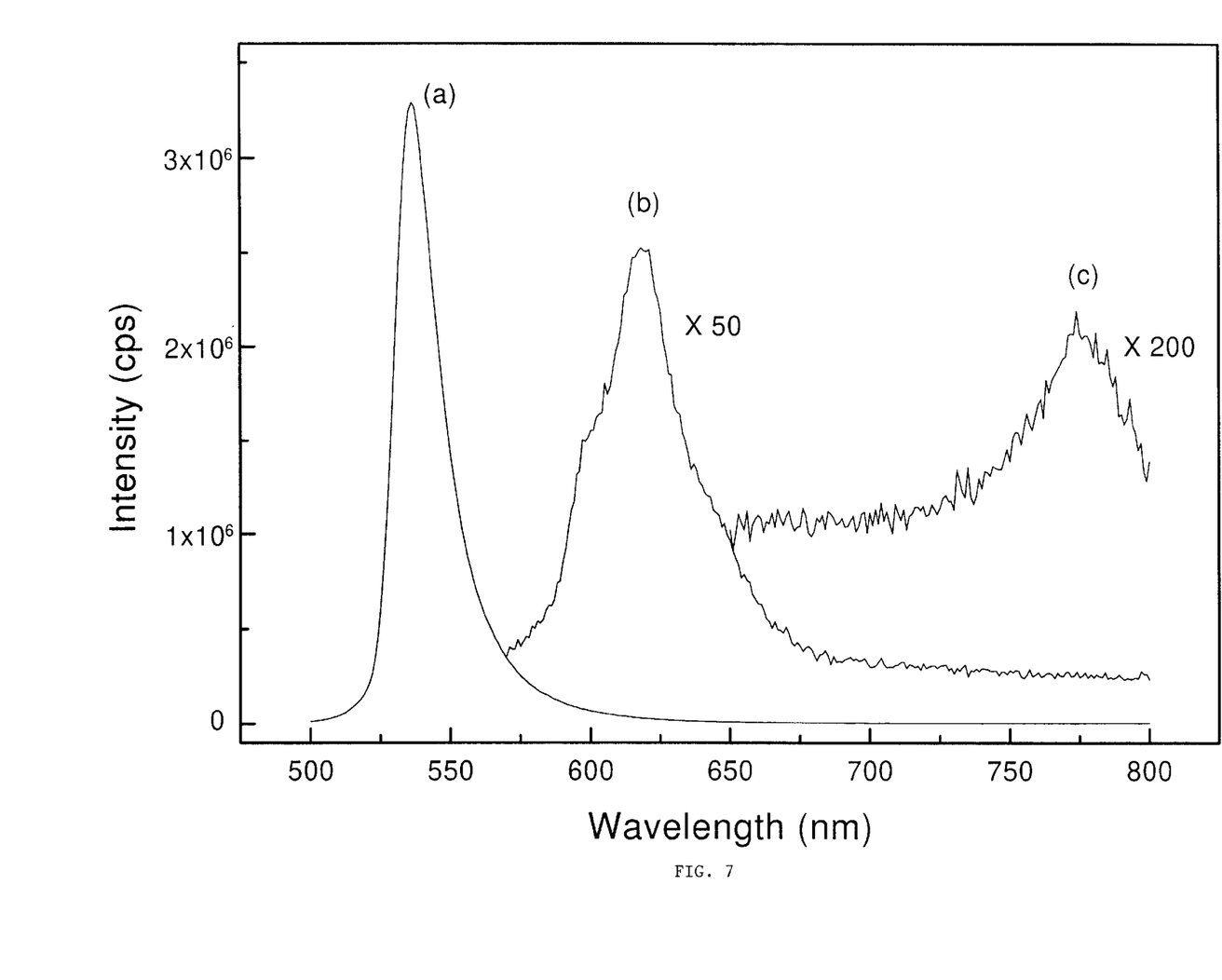
FIG. 7 shows emission spectra of perovskite thin films prepared using the dipping technique, with an excitation wavelength of 480 nm, for (A) $(C_4H_9NH_3)_2PbI_4$ (B) $(C_4H_9NH_3)_2(CH_3NH_3)Pb_2I_7$, and (C) $CH_3NH_3PbI_3$.

When the thin films of $(C_4H_9NH_3)_2PbI_4$, prepared using the dipping method, were exposed to a hand-held ultraviolet light (366 nm), they emitted strong green luminescence, which was evenly distributed across the whole film surface (approximately 1.5 cm$^2$). FIG. 7(A) shows the emission spectra for this sample. A strong, sharp peak was observed at 537 nm, with full width at half height of 20 nm, when the film was excited at 480 nm. The emission peak position was independent of the excitation wavelength. It was found that there was no explicit relation between emission spectrum and the dipping duration. Both the peak profile and width were virtually the same in all thin films with dipping duration ranging from 5 seconds to 10 minutes.

Compared to the emission spectra of single crystals samples, the spectra of $(C_4H_9NH_3)_2PbI_4$ films, prepared from evaporated $PbI_2$, were red-shifted by about 10 nm. While it was not possible to measure the absorption spectra of these films since they were not transparent, the excitation spectrum did show a sharp peak at 523 nm, which corresponds to the absorption of the exciton state within the inorganic perovskite sheets. For comparison, the absorption spectrum of a thin film of $(C_4H_9NH_3)_2PbI_4$, prepared from a spin-coated $PbI_2$ film (which was transparent), exhibited a sharp exciton peak at 524 nm. The luminescence peak in these films was at 525 nm, which matches the results from the solution grown crystals. Because the emission peak arises from an exciton state in the inorganic sheets of the layered perovskite structure, it is possible that subtle changes in the crystal lattice of these films relative to the single crystal samples (perhaps due to organic cation disordering) may significantly impact the luminescence properties and account for the 10 nm red-shift for the films produced from the evaporated $PbI_2$ films. It is also possible that differences in grain size and crystallographic orientation in these films, as suggested from the AFM results, could contribute to the shift in wavelength. Perhaps the most likely explanation arises from states near the band edge of the perovskite layer, which could be due to defects in the crystal structure or surface states.

The thin films of the perovskite, $(C_6H_5C_2H_4NH_3)_2PbI_4$, prepared from evaporated $PbI_2$, showed similar photoluminescence to the butylammonium analog. Upon exciting at 480 nm, an emission peak at 537 nm, with full width at half height of 14 nm was observed. This emission was also red-shifted about 10 nm relative to the emission of single crystals of $(C_6H_5C_2H_4NH_3)_2PbI_4$, similar to the case for $(C_4H_9NH_3)_2PbI_4$. The photoluminescence characteristics of $(C_4H_9NH_3)_2PbI_4$ and $(C_6H_5C_2H_4NH_3)_2PbI_4$ were very similar, presumably because they have similar structures within the inorganic sheets. Furthermore, this similarity suggests that the interactions between adjacent inorganic sheets are insignificant in $(C_6H_5C_2H_4NH_3)_2PbI_4$ and $(C_4H_9NH_3)_2PbI_4$, because the former has a substantially longer distance between adjacent inorganic sheets (16.316Å for $(C_6H_5C_2H_4NH_3)_2PbI_4$ vs. 13.794Å for $(C_4H_9NH_3)_2PbI_4$).

The red films of $(C_4H_9NH_3)_2(CH_3NH_3)Pb_2I_7$ emitted at 618 nm when excited at 480 nm (FIG. 7(b)), with full width at half height of approximately 30 nm. The emission wavelength was red-shifted by about 83 nm relative to that of $(C_4H_9NH_3)_2PbI_4$. Although the absolute efficiency was not determined, the photoluminescence from the n=2 thin films was significantly weaker than for the $(C_4H_9NH_3)_2PbI_4$ films. In contrast to $(C_4H_9NH_3)_2PbI_4$, the inorganic sheets of $(C_4H_9NH_3)_2(CH_3NH_3)Pb_2I_7$ have a bilayer structure. It has been previously reported that in the family, $(C_6H_5C_2H_4NH_3)_2(CH_3NH_3)_{n-1}Pb_{3n+1}I_3$, the band-gap energy, the lowest exciton energy, and the exciton binding energy all decrease with increasing sheet thickness (increasing n) as a result of quantum confinement or dimensionality effects. As a consequence, the exciton state in layered perovskites with thicker sheets is progressively less stable, and the emission associated with this exciton state correspondingly red-shifts. This accounts for the red-shifted emission and relatively low emissive efficiency for the thin films of $(C_4H_9NH_3)_2(CH_3NH_3)Pb_2I_7$, relative to the n=1 member of the $(C_4H_9NH_3)_2(CH_3NH_3)Pb_2I_{3n+1}$ family. As the n=∞ member, the thin film of $CH_3NH_3PbI_3$ emitted even more weakly, with a further red-shift of the emission peak to 780 nm (FIG. 7(C)). The emission peak was broad, with fall width at half height of approximately 40 nm. The absorption spectrum of these films had a step-shaped profile with the absorption edge at approximately 1.6 eV, which is in good agreement with the reported bandgap of $CH_3NH_3PbI_3$.

The films of $(C_4H_9NH_3)_2SnI_4$ and $(C_6H_5C_2H_4NH_3)_2SnI_4$ emitted at 639 nm and 629 nm, respectively. Qualitatively, their emissions were weaker relative to their Pb counterparts, which is in agreement with the conclusion drawn from a comparison with the corresponding solution-grown crystals. The $CH_3NH_3SnI_3$ films, however, were not emissive under similar conditions at room temperature.

The emission intensities of thin films of the layered perovskites were comparable to those of the corresponding single crystal samples. It has been found that the luminescence of these layered perovskites is very sensitive to defects in the structure. For $(C_4H_9NH_3)_2PbI_4$, poorly crystallized samples, finely ground crystals, or pressed pellets prepared by solid state synthesis, exhibit very little, if any, photoluminescence at room temperature. The fact that thin films of the layered perovskites made by the dipping technique have strong photoluminescence indicates that they are well-crystallized and have few non-radiative decay centers for the excitons.

As a potential emitter material for electroluminescent devices, organic-inorganic layered perovskites offer many potential advantages over conventional organic or inorganic materials. In addition to their strong photoluminescence, they have higher mobility relative to pure organic emitter materials, and much more processing flexibility and luminescence tunability compared to inorganic emitter materials. The quality of the perovskite thin films is very important for retaining their luminescent properties. Spin-coating enables simple processing of well-crystallized thin films, which can locally be very smooth. However, control over film thickness and uniformity over large areas is difficult, and this technique would not be suitable for inorganic and organic constituents which have incompatible solubility characteristics. Vacuum deposition is another promising technique which allows precise control of the thickness and smoothness of the films, but involves the often difficult to control process of evaporating the organic salt.

The two-step dipping technique of this invention can be considered a hybrid between the vacuum deposition and solution chemistry techniques. It not only takes advantage of the vacuum deposition technique with respect to managing film thickness and uniformity, but also retains the benefits of the solution chemistry methods in the sense that well-crystallized films can be generated without heating the organic component for evaporation. In addition to using evaporated $MX_2$ films as a first step, spin-coated films can also be used if this is more compatible with the system under consideration.

The convenience of this novel technique lies in its stepwise nature. The $MX_2$ films can be prepared in advance and can then be used to form the desired perovskites just before they are needed. The fact that only the evaporation of $MX_2$ is required significantly simplifies the preparation process, and furthermore enables syntheses in which two organic salts are used. In addition, single source evaporation of $MX_2$ helps to maintain a clean deposition environment. For the dipping technique, the main factors influencing the quality of the films are the choices of solvent for dissolving organic ammonium salts and the dipping duration. These two factors are relatively easy to control. As a consequence, high-quality thin films can now be conveniently prepared. For applications which require patterning, the dipping technique may also provide a promising pathway, since prior to the dipping step the surface of the film can be coated with a resist so that only selected areas are exposed to the organic cation in solution.

The versatility of the dipping technique has also been demonstrated in this work by preparing a variety of perovskites, $(RNH_3)_2(CH_3NH_3)_{n-1}M_nX_{3n+1}$, with n=1, . . . 2,..., ∞, using virtually the same dipping procedures. When n→∞, the resulting structure is three dimensional and is no longer layered. When n is not equal to infinity, the layered structure of the preceding formula is commonly referred to as the <100> oriented (in crystallographic nomenclature) family because the perovskite sheets have <100> orientation. Also, the methylammonium cation ($CH_3NH_3^+$) may be replaced by a monovalent alkali metal cation (e.g., $Cs^+$, $Rb^+$, $K^+$). For a given metal, "M", the family of perovskites can be prepared by simply varying the organic ammonium cations or by using mixed cations in the dipping solution. While we have demonstrated here the group fourteen metal iodide based systems (using tin (II) and lead (II), the other possibility being Ge(II)) with relatively simple organic cations, a variety of other perovskites, with various metals, halogens, or more complex organic ammonium cations (i.e., $RNH_3^+$) are expected to form by dipping $MX_2$ (X=Cl, Br, I) thin films into the corresponding organic ammonium halide solutions. These other metals might also include the divalent rare-earth metals and transition metals. The general criteria for selecting the organic ammonium iodides for the dipping solution are that they have one or more ammonium groups ($NH_3$) that are appropriately oriented on the organic molecule to allow for effective hydrogen bonding between the organic ammonium cation and the metal halide layers of the perovskite structure. In addition, the organic molecule must be chosen such that it is crystallographically compatible with the layered perovskite structure (i.e., will "fit" into the structure). Finally, it is expected that members of the <110> oriented family of perovskites can be formed by the method of the invention. Such <110> oriented perovskites are also denoted by the general formula $(NH_2C(I)=NH_2)_2(CH_3NH_3)_nM_nX_{3n+2}$ with n=1, 2, . . . ∞.

What is claimed:

1. A method for preparing thin films of organic-inorganic perovskites comprising the steps of:
    a) depositing a film of a divalent metal halide, $MX_2$, on a substrate;
    b) preparing a dipping solution of a solvent and one or more organic ammonium halides; and
    c) dipping said film on said substrate into said solution for a time sufficient to form a thin film of organic-inorganic perovskite.

2. The method of claim 1 wherein said metal of said metal halide is one selected from the group comprising the divalent transition metals, the group fourteen metals and the rare earth metals and mixtures thereof and said halide is one selected from the group comprising iodine, bromine and chlorine and mixtures thereof.

3. The method of claim 1 wherein said solvent is one characterized in that it is a poor solvent for said metal halide and resulting organic-inorganic perovskite but a good solvent for the one or more organic ammonium halides of said dipping solution.

4. The method of claim 1 wherein said organic ammonium halide has one or more ammonium groups for hydrogen bonding to said metal halide and is crystallographically compatible with said perovskite structure.

5. The method of claim 1 wherein said depositing is performed by vacuum evaporation.

6. The method of claim 1 wherein said depositing is performed by spin-coating.

7. The method of claim 1 wherein said dipping is performed at room temperature.

8. A method for preparing thin films of organic-inorganic perovskites having the formula $(RHN_3)_2(CH_3NH_3)_{n-1}M_nX_{3n+1}$ comprising the steps of:
   a) depositing a film of metal halide, $MX_2$, onto a substrate;
   b) preparing a dipping solution of a solvent and one or more ammonium cations;
   c) dipping said film on said substrate into said solution for a time sufficient to form a thin film of said organic-inorganic perovskite.

9. The method of claim 8 wherein said depositing is performed by vacuum evaporation.

10. The method of claim 8 wherein said depositing is performed by spin-coating.

11. The method of claim 8 wherein said dipping is performed at room temperature.

12. The method of claim 8 wherein said $MX_2$ is $PbI_2$ and said dipping solution is a 38 mM solution of butylammonium iodide in a 1:6 ratio solution of 2-propanol/toluene solvent and the resultant perovskite is $(C_4H_9NH_3)_2PbI_4$.

13. The method of claim 8 wherein said $MX_2$ is $PbI_2$ and said dipping solution is a 77 mM solution of phenethylammonium iodide in a 1:6 ratio solution of 2-propanol/toluene solvent and the resultant perovskite is $(C_6H_5C_2H_4NH_3)_2PbI_4$.

14. The method of claim 1 wherein said $MX_2$ is $PbI_2$ and said dipping solution is a 127 mM solution of methylammonium iodide in 2-propanol solvent and the resultant perovskite is the three-dimensional perovskite $CH_3NH_3PbI_3$.

15. The method of claim 8 wherein including a second dipping step.

16. The method of claim 15 wherein said $MX_2$ is $PbI_2$, said dipping solution is a 38 mM solution of butylammonium iodide in a 1:6 ratio solution of 2-propanol/toluene solvent, said second dipping solution is a mixed solution of 2 equivalents of butylammonium iodide and 1 equivalent of methylammonium iodide in a 1:5 ratio solution of 2-propanoltoluene solvent, and the resultant perovskite is the bilayer perovskite $(C_4H_9NH_3)_2(CH_3NH_3)Pb_2I_7$.

17. The method of claim 8 wherein said $MX_2$ is $SnI_2$ and said dipping solution is a 70 mM butylammonium iodide 2-propanol/toluene (1:16 v/v) solution and the resultant perovskite is $(C_4H_9NH_3)_2SnI_4$.

18. The method of claim 8 wherein said $MX_2$ is $SnI_2$ and said dipping solution is a saturated phenethylammonium iodide 2-propanol/toluene (1:16, v/v) solution and the resulting perovskite is $(C_6H_5C_2H_4NH_3)_2SnI_4$.

19. The method of claim 8 wherein said $MX_2$ is $SnI_2$ and said dipping solution is an 88 mM methylammonium iodide 2-propanol solution and the resultant perovskite is $CH_3NH_3SnI_3$.

* * * * *